(12) United States Patent
Xu et al.

(10) Patent No.: US 11,764,157 B2
(45) Date of Patent: Sep. 19, 2023

(54) RUTHENIUM LINER AND CAP FOR BACK-END-OF-LINE APPLICATIONS

(71) Applicant: Applied Materials, Inc., Santa Clara, CA (US)

(72) Inventors: Wenjing Xu, San Jose, CA (US); Feng Chen, San Jose, CA (US); Tae Hong Ha, San Jose, CA (US); Xianmin Tang, San Jose, CA (US); Lu Chen, Cupertino, CA (US); Zhiyuan Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/383,361

(22) Filed: Jul. 22, 2021

(65) Prior Publication Data

US 2022/0028795 A1   Jan. 27, 2022

Related U.S. Application Data

(60) Provisional application No. 63/055,858, filed on Jul. 23, 2020.

(51) Int. Cl.
*H01L 23/532* (2006.01)
*H01L 23/522* (2006.01)
*H01L 21/768* (2006.01)

(52) U.S. Cl.
CPC .. *H01L 23/53238* (2013.01); *H01L 21/76844* (2013.01); *H01L 21/76846* (2013.01); *H01L 21/76849* (2013.01); *H01L 23/5226* (2013.01)

(58) Field of Classification Search
CPC ......... H01L 23/53238; H01L 21/76844; H01L 21/76846; H01L 21/76849; H01L 23/5226; H01L 2221/1063
See application file for complete search history.

(56) References Cited

U.S. PATENT DOCUMENTS

| | | | |
|---|---|---|---|
| 11,171,051 B1* | 11/2021 | Fullam | H01L 21/76877 |
| 2008/0237860 A1 | 10/2008 | Ishizaka et al. | |
| 2008/0280151 A1 | 11/2008 | Jourdan et al. | |
| 2010/0015798 A1* | 1/2010 | Suzuki | H01L 21/76849 |
| | | | 438/653 |
| 2018/0053725 A1* | 2/2018 | Edelstein | H01L 21/3212 |
| 2020/0144107 A1* | 5/2020 | Dutta | H01L 21/76816 |

OTHER PUBLICATIONS

PCT International Search Report and Written Opinion in PCT/US2021/042899 dated Nov. 18, 2021, 10 pages.

* cited by examiner

*Primary Examiner* — Karen Kusumakar
(74) *Attorney, Agent, or Firm* — Servilla Whitney LLC (57) ABSTRACT

Electronic devices and methods of forming electronic devices using a ruthenium or doped ruthenium liner and cap layer are described. A liner with a ruthenium layer and a cobalt layer is formed on a barrier layer. A conductive fill forms a second conductive line in contact with the first conductive line.

6 Claims, 5 Drawing Sheets

RUTHENIUM LINER AND CAP FOR BACK-END-OF-LINE APPLICATIONS

CROSS-REFERENCE TO RELATED APPLICATIONS

This application claims priority to U.S. Provisional Application No. 63/055,858, filed Jul. 23, 2020, the entire disclosure of which is hereby incorporated by reference herein.

TECHNICAL FIELD

Embodiments of the disclosure generally relate to methods for forming interconnects in electronic devices. In particular, embodiments of disclosure relate to methods and electronic devices using a ruthenium-containing bilayer for liner and capping.

BACKGROUND

The miniaturization of semiconductor circuit elements has reached a point where feature sizes of 20 nm and less are fabricated on a commercial scale. As the critical dimensions continue to decrease in size, new challenges arise for process steps like filling a gap between circuit elements. As the width between the elements continues to shrink, the gap between the elements often gets taller and narrower, making the gap more difficult to fill and contacts more difficult to make robust.

From the 20 nm node to the 3 nm node, cobalt (Co) liner and Co capping have been the main material that enhances the copper (Cu) gap fill and reliability. For the 3 nm plus node and beyond, the gap fill on cobalt liners has shown several limitations.

Copper reflow on ruthenium (Ru) liners has shown potential extendibility for small structures. However, there are reliability issues with using ruthenium. For example, copper corrosion of interconnects has been observed resulting in decreased device lifetimes.

Accordingly, there is a need for methods for improved interconnect formation in electronic devices.

SUMMARY

One or more embodiments of the disclosure are directed to electronic devices. A first conductive line extends along a first direction. A dielectric material is formed on a substrate surface on the first conductive line. The dielectric material has a top surface with a surface structure formed in a surface of the dielectric material. The surface structure has sidewalls and a via bottom. The via bottom comprises a top surface of the first conductive line. A barrier layer is formed on the top surface of the dielectric material and the sidewalls. A liner is formed on the barrier layer. The liner has a liner bottom surface spaced a distance from the top surface of the first conductive line. A conductive fill is within the surface structure. The conductive fill forms a second conductive line extending along a second direction and contacts the first conductive line.

Additional embodiments of the disclosure are directed to methods of forming an electronic device. A passivation layer is formed in a via portion of a surface structure formed in a dielectric material. The passivation layer is formed on a surface of a first conductive material and separated from the dielectric material by a barrier layer formed on sidewalls, a bottom of a trench portion of the surface structure and a top of the dielectric material. The first conductive material extends along a first direction. A liner is formed on the barrier layer. The liner has a liner bottom surface contacting the passivation layer in the via portion. The passivation layer is removed to leave the bottom surface of the liner spaced a distance from the top surface of the first conductive line. The surface structure is filled with a conductive fill to form a via in the via portion and a second conductive line in the trench portion. The second conductive line extends along a second direction. The via contacts the first conductive line in the via portion. A cap layer is formed on the conductive fill.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Ruthenium (Ru) as liner has not been able to be used for N3 (3 nm node) before due, at least, to reliability, line resistance Rs, copper corrosion, chemical-mechanical planarization (CMP) and other integration issues. Some embodiments use ruthenium in the N2 node with, optionally, Ru (doped Ru, bottomless Ru) liner and/or Ru (doped Ru) capping to alleviate process integration issues. Some embodiments use a bottomless ruthenium liner to prevent copper corrosion and reduce via resistance. The bottomless liner of some embodiments is deposited by selectively depositing ruthenium on the dielectric surfaces over the copper surface.

One or more embodiments of the disclosure allow for the replacement of cobalt with ruthenium as a liner and capping layer in advanced node applications. Some embodiments solve the reliability issues that limit ruthenium applications from larger node devices. Some embodiments of the disclosure provide overall integration schemes to enable ruthenium as the liner for gap fill extendibility, to enable ruthenium as a capping layer for reliability, reduce the via contact resistance (Rc), and/or prevent or slow copper corrosion.

Some embodiments of the ruthenium liner or a doped ruthenium liner extend the physical vapor deposition (PVD) copper reflow as the gap fill solution for advanced nodes. Some embodiments provide ruthenium or doped ruthenium capping to improve device reliability. Some embodiments incorporate a surfactant assisted ruthenium process to achieve devices without ruthenium on the bottom of the structures to prevent corrosion and improve via resistance.

FIGS. 1 through 6B illustrate an electronic device 100 during different stages of a method according to one or more embodiment of the disclosure. The various fill patterns used in the Figures are for ease of distinguishing components and should not be interpreted as referring to any particular material.

Figure 1:
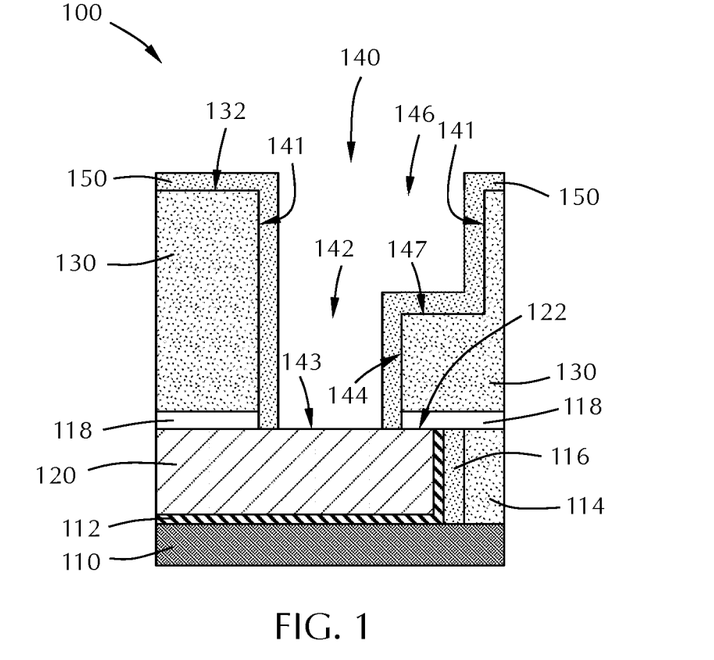
FIG. 1 shows a partial cross-sectional view of an electronic device being formed according to one or more embodiment of the disclosure.

Referring to FIG. 1, a first conductive line 120 is formed on a substrate 110 and extends along a first direction. The first direction may also be referred to as the X-axis direction. For example, the first conductive line 120 of some embodiments has a length along the X-axis direction, a width along the Y-axis direction and a thickness measured along the Z-axis direction. The Figures show the X-Z plane with the Y-axis extending perpendicular to the page of the Figures. The use of X, Y and Z axes should not be taken as implying any particular orientation with respect to gravity.

In the illustrated embodiment, various spacer layers 112, 114, 116, 118 are illustrated. These various spacer layers are optional and in some embodiments any or all of the layers are omitted. The use of the term "spacer layer" is not intended to imply any particular function or purpose to the illustrated layers. The spacer layers 112, 114, 116, 118 can be any suitable material with any suitable purpose. For example, spacer layers can include dielectrics, diffusion barriers, adhesion promotors, or any other layer known to the skilled artisan. In some embodiments, spacer layer 114 comprises a dielectric material, spacer layers 112, 116 comprise a barrier or liner materials to prevent direct contact between the first conductive line 120 and the substrate 110.

In some embodiments, forming the first conductive line 120 comprises filling trenches with a layer of conductive material. In one or more embodiments, a base layer (not shown) is first deposited on the internal sidewalls and bottom of the trenches, and then the conductive layer is deposited on the base layer (e.g., spacer layer 112). In one or more embodiments, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the first insulating layer 104. Additionally, the conductive barrier layer can be used to provide adhesion for the seed layer (e.g., copper).

The first conductive line 120 can be formed by any suitable process known to the skilled artisan. For example, in some embodiments, the first conductive line 120 is formed by one or more of electroplating process, selective deposition, electrolysis, chemical vapor deposition (CVD), physical vapor deposition (PVD), molecular beam epitaxy (MBE), atomic layer deposition (ALD), spin-on techniques, or other deposition techniques know to one of ordinary skill in the art of microelectronic device manufacturing.

The first conductive line 120 can be any suitable conductive material known to the skilled artisan. In one or more embodiments, the first conductive line 120 comprises a metal, for example, copper (Cu), ruthenium (Ru), nickel (Ni), cobalt (Co), molybdenum (Mo), rhodium (Rh), iridium (Ir), niobium (Nb), nickel silicon (NiSi), ternary compounds (e.g., $LaRu_2As_2$), or any combination thereof.

The first conductive line 120 can have any suitable thickness (as measured along the Z-axis of FIG. 1). In some embodiments, the first conductive line 120 has thickness in the range of 15 nm to 1000 nm, or in the range of 20 nm to 200 nm. In one non-limiting example, the width (as measured along the y-axis of FIG. 1 which extends perpendicular to the plane of the page) of the first conductive line 120 is in the range of 5 nm to 500 nm. In one non-limiting example, the spacing (pitch) between adjacent first conductive lines 120 is in the range of 2 nm to 500 nm, or in the range of 50 nm to 50 nm.

A dielectric material 130 is formed on the substrate surface (first conductive line 122 top surface) on the first conductive line 120. As used in this manner, the substrate surface is the exposed surface of material that the dielectric material 130 is formed upon. For example, the first conductive line 120 of some embodiments is formed on the surface of substrate 110, and forms a new substrate surface upon which the dielectric material 130 is formed.

In some embodiments, the dielectric material 130 has a top surface 132 with a surface structure 140. The surface structure 140 is formed in the top surface 132 of the dielectric material 130. In some embodiments, the surface structure 140 comprises sidewalls 141, a via portion 142 and a trench portion 146. The via portion 142 of some embodiments comprises a via bottom 143 and a via sidewall 144 opposite sidewall 141. In some embodiments, the via bottom 143 comprises the top surface 122 of the first conductive line 120.

The trench portion 146 of some embodiments comprises a trench bottom 147 connecting the via sidewall 144 with the sidewall 141 to form a stepped structure, as illustrated. In some embodiments, the surface structure 140 comprises a uniform shaped via or trench without the stepped structure.

The dielectric material 130 can be any material suitable to insulate adjacent devices and prevent leakage. In one or more embodiments, dielectric material 130 is an oxide layer, e.g., silicon dioxide, or any other electrically insulating layer determined by an electronic device design. In one or more embodiments, dielectric material 130 comprises an interlayer dielectric (ILD). In one or more embodiments, dielectric material 130 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof. While the term "silicon oxide" may be used to describe the dielectric material 130, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like.

In one or more embodiments, dielectric material 130 includes a dielectric material having a κ-value less than 5. In one or more embodiments, dielectric material 130 includes a dielectric material having a κ-value of from about 2 to about 4. In at least some embodiments, dielectric material 130 includes oxides, carbon doped oxides, Black Diamond®, porous silicon dioxide, carbides, oxycarbides, nitrides, oxynitrides, oxycarbonitrides, polymers, phosphosilicate glass, fluorosilicate (SiOF) glass, organosilicate glass (SiOCH), fluorosilicate glass (FSG), porous low-κ, or any combinations thereof, other electrically insulating layer determined by an electronic device design, or any combination thereof. In at least some embodiments, dielectric material 130 may include polyimide, epoxy, photodefinable materials, such as benzocyclobutene (BCB), and WPR-series materials, or spin-on-glass.

In one or more embodiments, dielectric material 130 is a low-K interlayer dielectric to isolate one metal line from other metal lines on substrate 110. In one or more embodiments, the thickness of the dielectric material 130 is in an approximate range from about 10 nanometers (nm) to about 2 microns (μm).

In one or more embodiments, dielectric material 130 is deposited or formed using one of deposition techniques, such as but not limited to a plasma enhanced chemical vapor deposition ("PECVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In some embodiments, the surface structure 140 is formed by any suitable technique known to the skilled artisan. In some embodiments, the dielectric material 130 is patterned and etched using a hard mask to form surface structure 140 using one or more patterning and etching techniques known to one of ordinary skill in the art of microelectronic device manufacturing.

A barrier layer 150 is formed on the top surface 132 of the dielectric layer 130 and on the sidewalls 141 of the surface structure 140. In some embodiments, the barrier layer 150 is formed on the via sidewall 144 and trench bottom 147 in addition to the sidewall 141 and top surface 132 of the dielectric material 130, as shown in FIG. 1. In some embodiments, the barrier layer 150 is formed conformally on the sidewalls 141, top surface 132, via sidewall 144 and trench bottom 147.

The barrier layer 150 may comprise any suitable material known to the skilled artisan formed by any suitable technique known to the skilled artisan. In one or more embodiments, the barrier layer 150 comprises one or more of titanium nitride (TiN), tantalum nitride (TaN), or the like. In some embodiments, the barrier layer is deposited by atomic layer deposition.

In some embodiments, the barrier layer 150 is selectively deposited on the dielectric material 130 over the first conductive line 120. For example, as illustrated, the barrier layer 150 forms in contact with the dielectric material 130 but does not nucleate, or experiences a relatively long nucleation delay on the first conductive line 120.

Figure 2:
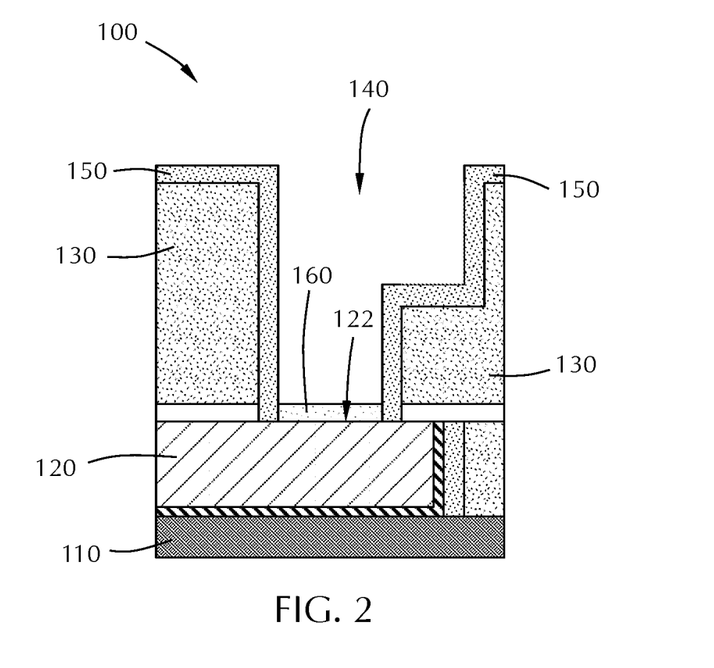
FIG. 2 shows a partial cross-sectional view of an electronic device being formed according to one or more embodiment of the disclosure.

Referring to FIG. 2, a passivation layer 160 is formed on the exposed top surface 122 of the first conductive line 120 through the surface structure 140. The passivation layer 160 can be any suitable material known to the skilled artisan and deposited by any suitable technique. In some embodiments, the passivation layer 160 is selectively deposited on the first conductive line 120 over the barrier layer 150. The passivation layer 160 can be any material that protects the first conductive line 120 from subsequent formation of liner 170. The passivation layer 160 of some embodiments has thickness in the range of 5 Å to 1000 Å, or in the range of 1 nm to 50 nm.

Stated differently, in some embodiments, a passivation layer 160 is formed in a via portion 142 of surface structure 140 formed in a dielectric material 130. The passivation layer 160 is formed on a surface of a first conductive material 120 and is separated from the dielectric material 130 by a barrier layer 150 formed on sidewalls 141, via sidewall 144 and bottom of a trench portion 146 of the surface structure 140 and a top surface 132 of the dielectric material 130.

Figure 3A:
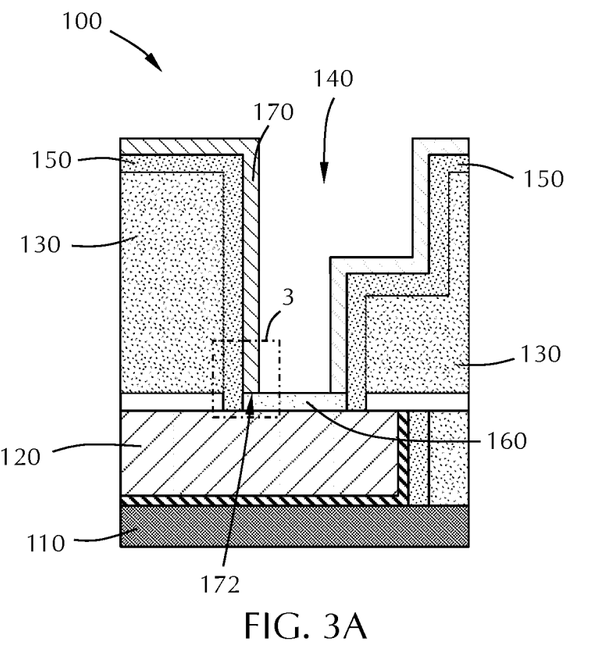
FIG. 3A shows a partial cross-sectional view of an electronic device being formed according to one or more embodiment of the disclosure.
Figure 3B:
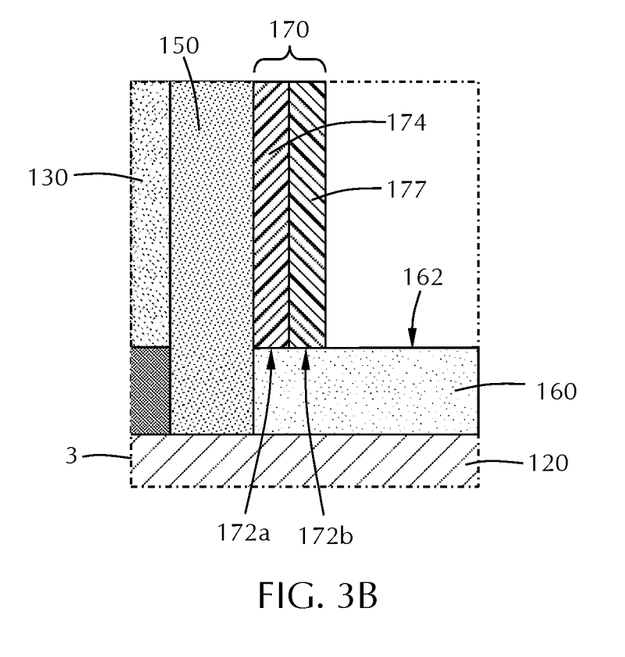
FIG. 3B shows an expanded view of region 3 of FIG. 3A.

Referring to FIG. 3A and expanded region 3 shown in FIG. 3B, a liner 170 is formed on the barrier layer 150. The liner 170 of some embodiments is formed conformally on the barrier layer 150. In some embodiments, the liner 170 is formed selectively on the barrier layer 150 over the passivation layer 160. The Figures show the liner 170 contacting the passivation layer 160; however, the skilled artisan will recognize that the liner 170 does not nucleate on the passivation layer 160 and contact between the liner 170 and the passivation layer 160 is physical, not chemical.

With the passivation layer 160 on the first conductive line 120, the liner 170 forms with a liner bottom surface 172 spaced a distance from the top surface 122 of the first conductive line 120. The distance between the top surface 122 of the first conductive line 120 and the liner bottom surface 172 of the liner 170 is defined by the thickness of the passivation layer 160.

Referring to the expanded view of region 3 shown in FIG. 3B, the liner 170 of some embodiments comprises a first liner layer and a second liner layer. The first liner layer has a first liner bottom surface 172a and the second liner layer has a second liner bottom surface 172b, each of the liner bottom surfaces spaced a distance from the top surface 122 of the first conductive line 120.

In some embodiments, the liner 170 comprises a ruthenium layer 174 in contact with the barrier layer 150 and a cobalt layer 177 on an opposite side of the ruthenium layer 174 from the barrier layer 150. Stated differently, in some embodiments, the liner 170 comprises a ruthenium layer 174 in direct contact with the barrier layer 150 and a cobalt layer 177 in contact with the ruthenium layer 174 separated from the barrier layer 150 by the ruthenium layer 174.

In some embodiments, the liner 170 has a total thickness (i.e., the sum of the thickness of all layers) in the range of 5 Å to 50 Å. The thickness of the liner 170 is measured along the sidewalls 141, via sidewall 144 and trench bottom 147 of the surface structure 140. In some embodiments, the ruthenium layer 174 has a thickness in the range of 2.5 Å to 25 Å, or in the range of 5 Å to 20 Å, or in the range of 10 Å to 15 Å. In some embodiments, and the cobalt layer 177 has a thickness in the range of 2.5 Å to 25 Å, or in the range of 5 Å to 20 Å, or in the range of 10 Å to 15 Å. In some embodiments, the ruthenium layer 174 and the cobalt layer 177 have about the same thickness. In some embodiments, the ruthenium layer 174 and the cobalt layer 177 have a thickness ratio in the range of 0.95:1 to 1:0.95. In some embodiments, the ruthenium:cobalt thickness ratio is about 1:1. In some embodiments, each of the ruthenium and cobalt layers are about 10 Å thick.

In some embodiments, the liner 170 comprises binary layers of ruthenium and cobalt, where the ruthenium contacts the barrier layer 150. The ruthenium can be ruthenium metal or a doped ruthenium. Suitable dopants include, but are not limited to, oxygen, nitrogen, boron, carbon, copper, tungsten, molybdenum aluminum, or manganese.

The liner 170 can be deposited by any suitable technique known to the skilled artisan. In some embodiments, the liner 170 or individual layers of the liner are deposited by atomic layer deposition.

Figure 4A:
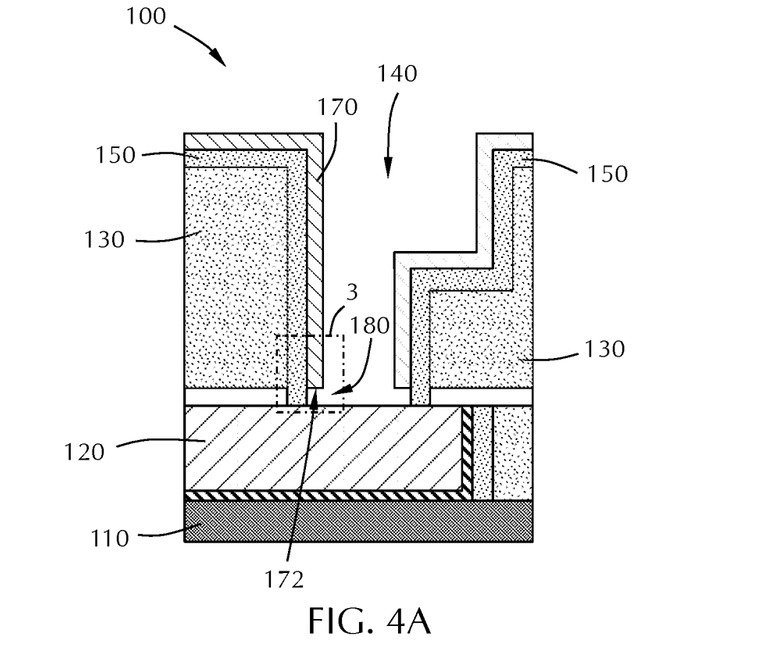
FIG. 4A shows a partial cross-sectional view of an electronic device being formed according to one or more embodiment of the disclosure.
Figure 4B:
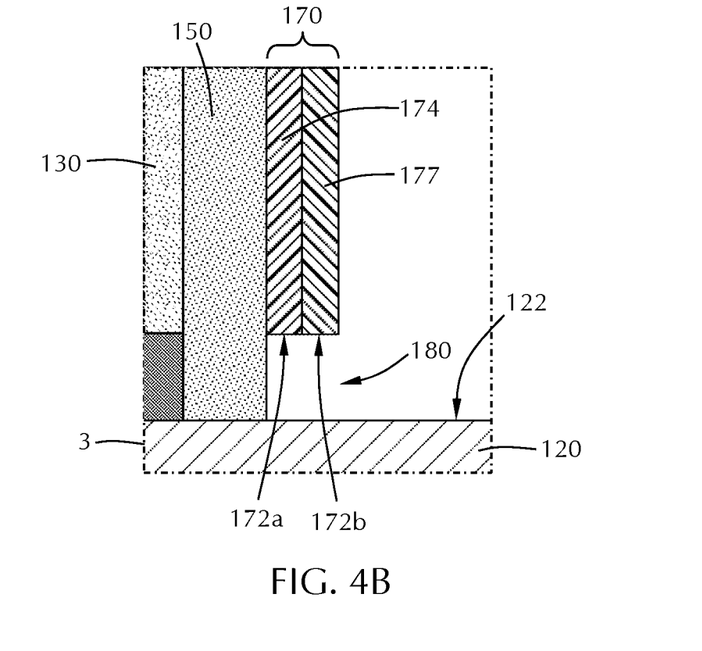
FIG. 4B shows an expanded view of region 3 of FIG. 4A.

In some embodiments, after formation of the liner 170, the passivation layer 160 is removed, as shown in FIGS. 4A and 4B. Removing the passivation layer 160 leaves a gap 180 so that the liner bottom surface 172 is spaced a distance from the top surface 122 of the first conductive line 120. The distance or thickness of the gap 180 is substantially the same (i.e., within ±10%) as the thickness of the passivation layer 160. The passivation layer 160 can be removed by any suitable technique depending on the materials used. In some embodiments, the passivation layer 160 is removed by a selective etch process that does not appreciably affect the other surface materials.

As shown in FIG. 4B, in some embodiments, removing the passivation layer 160 exposes the first liner bottom surface 172a and the second liner bottom surface 172b in the gap 180. Stated differently, in some embodiments, the liner 170 does not contact the first conductive line 120 so that there is a gap 180 between the top surface 122 of the first conductive line 120 and the bottom edge of the liner 170.

Figure 5A:
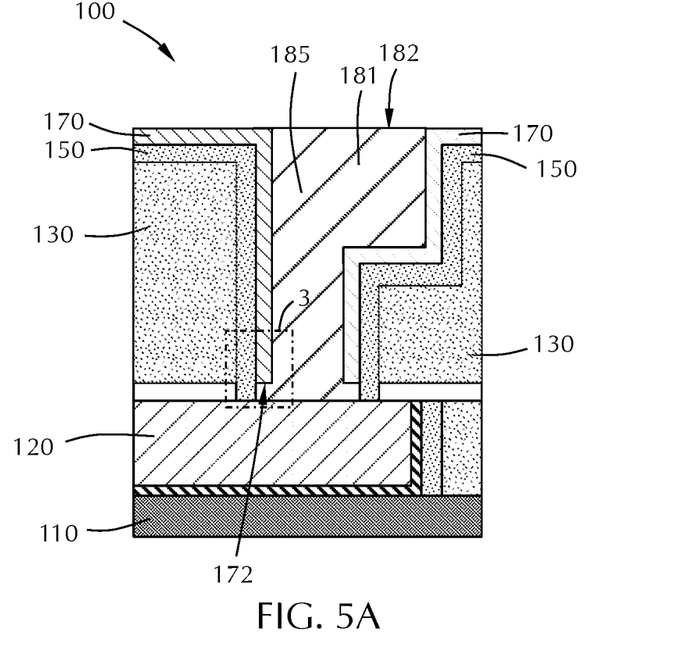
FIG. 5A shows a partial cross-sectional view of an electronic device being formed according to one or more embodiment of the disclosure.
Figure 5B:
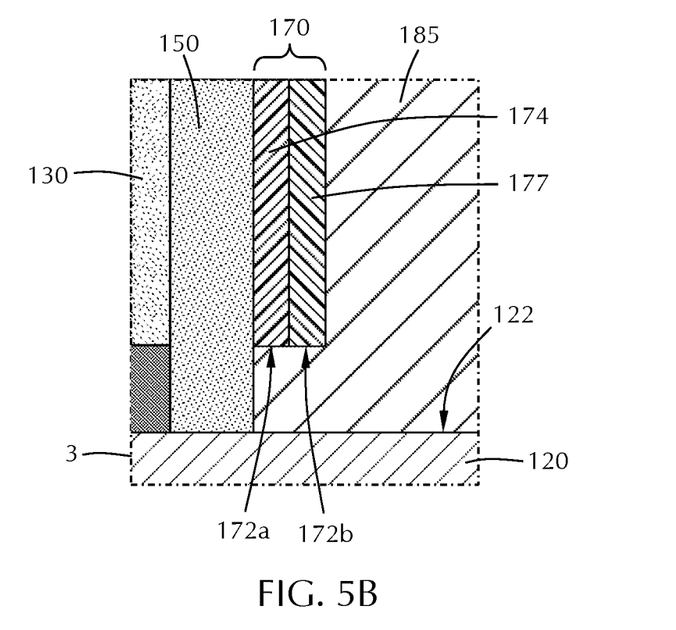
FIG. 5B shows an expanded view of region 3 of FIG. 5A.

Referring to FIGS. 5A and 5B, after removing the passivation layer 160, a conductive fill 185 is deposited within the surface structure 140. The conductive fill 185 forms a second conductive line 181 extending along a second direction. The conductive fill 185 (the second conductive line 181) is in direct contact with the first conductive line 120 at the via bottom 143 of the via portion 142 of the surface structure 140.

The conductive fill 185 can be any suitable material and any deposited by any suitable technique known to the skilled artisan. In some embodiments, the conductive fill 185 forming the second conductive line 181 comprises copper or consists essentially of copper. As used in this manner, the term "consists essentially of" means that the film comprises greater than or equal to 95%, 98%, 99% or 99.5% of the stated material.

The conductive fill 185 can be formed by any suitable technique known to the skilled artisan. In some embodiments, the conductive fill 185 is deposited by physical vapor deposition. In one or more embodiments, the second conductive material 220 comprises a metal film or a metal containing film. Suitable metal films for the conductive fill 185 include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, the conductive fill 185 forming the second conductive line comprises copper (Cu).

In one or more embodiments, the conductive fill 185 is deposited using one of deposition techniques, such as but not limited to an ALD, a CVD, PVD, MBE, MOCVD, spin-on or other liner deposition techniques known to one of ordinary skill in the art of microelectronic device manufacturing.

Figure 6A:
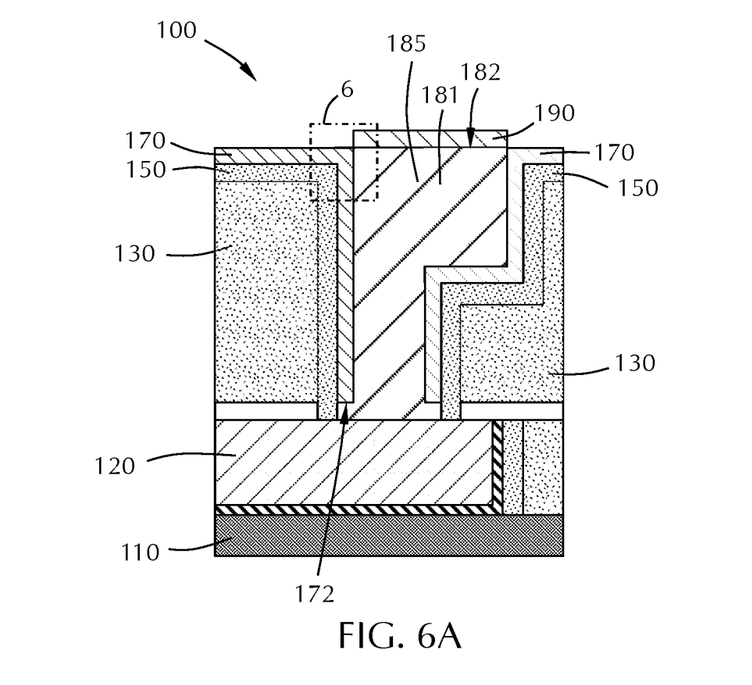
FIG. 6A shows a partial cross-sectional view of an electronic device being formed according to one or more embodiment of the disclosure.
Figure 6B:
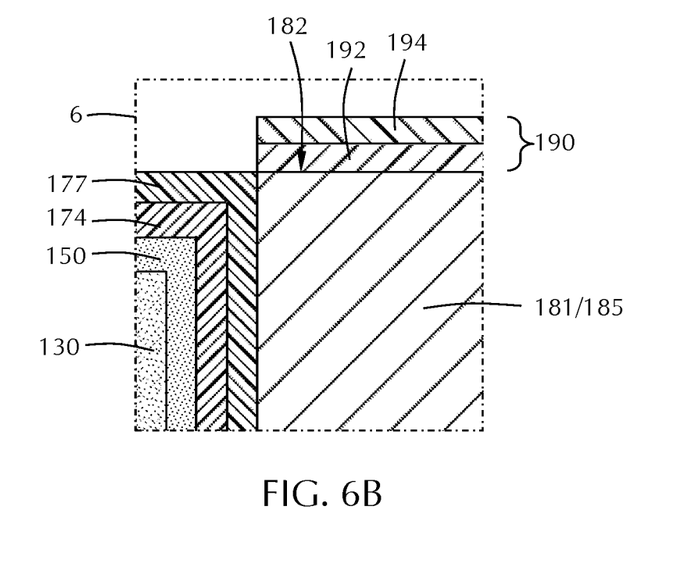
FIG. 6B shows an expanded view of region 6 of FIG. 6A.

Referring to FIGS. 6A and 6B, in some embodiments, a cap layer 190 is formed on the conductive fill 185 that makes the second conductive line 181. FIG. 6B shows expanded view of region 6 of FIG. 6A. In some embodiments, the cap layer 190 formed on the top surface 182 of the second conductive line 181 comprises a first capping layer and a second capping layer. In some embodiments, the cap layer 190 comprises a ruthenium layer 192 in contact with the conductive fill 185 that forms the second conductive line 181 and a cobalt layer 194 on an opposite side of the ruthenium layer 192 from the conductive fill 185 that is the second conductive line 181

Stated differently, in some embodiments, the capping layer 190 comprises a ruthenium layer 192 in direct contact with the second conductive line 181, and a cobalt layer 194 in contact with the ruthenium layer 192 separated from the second conductive line 181 by the ruthenium layer 192.

In some embodiments, the capping layer 190 has a total thickness (i.e., the sum of the thickness of all layers) in the range of 5 Å to 50 Å. In some embodiments, the ruthenium layer 192 has a thickness in the range of 2.5 Å to 25 Å, or in the range of 5 Å to 20 Å, or in the range of 10 Å to 15 Å. In some embodiments, and the cobalt layer 194 has a thickness in the range of 2.5 Å to 25 Å, or in the range of 5 Å to 20 Å, or in the range of 10 Å to 15 Å. In some embodiments, the ruthenium layer 192 and the cobalt layer 194 have about the same thickness. In some embodiments, the ruthenium layer 192 and the cobalt layer 194 have a thickness ratio in the range of 0.95:1 to 1:0.95. In some embodiments, the ruthenium:cobalt thickness ratio is about 1:1. In some embodiments, each of the ruthenium and cobalt layers are about 10 Å thick.

The capping layer 190 can be deposited by any suitable technique known to the skilled artisan. In some embodiments, the capping layer 190, or the individual layers, is deposited by atomic layer deposition. In some embodiments, the capping layer 190 is formed selectively on the top surface 182 of the second conductive line 181.

In some embodiments, use of a selective binary cap layer and a ruthenium liner increased electromigration failure time (at the 50% level) greater than 2.5×. Having Ru first then Co in the cap layer increased 50% failure rate over Co first then Ru by greater than 2×. Using a binary liner in addition to the binary cap layer increased failure time further.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming an electronic device, the method comprising:
    forming a passivation layer in a via portion of a surface structure formed in a dielectric material, the passivation layer formed on a surface of a first conductive material and separated from the dielectric material by a barrier layer formed on sidewalls, a bottom of a trench portion of the surface structure and a top of the dielectric material, the first conductive material extending along a first direction;
    forming a liner on the barrier layer, the liner having a liner bottom surface contacting the passivation layer in the via portion;
    removing the passivation layer to leave the bottom surface of the liner spaced a distance from a top surface of the first conductive line;
    filling the surface structure with a conductive fill to form a via in the via portion and a second conductive line in the trench portion, the second conductive line extending along a second direction, the via contacting the first conductive line in the via portion; and
    selectively forming a capping layer on a top surface of the second conductive line of the conductive fill, wherein selectively forming the capping layer comprises forming a first capping layer on the top surface of the second conductive line of the conductive fill; and forming a second capping layer directly on the first capping layer.

2. The method of claim 1, wherein the liner comprises a ruthenium layer in contact with the barrier layer and a cobalt layer on an opposite side of the ruthenium layer from the barrier layer.

3. The method of claim 2, wherein the ruthenium layer has a thickness in the range of 2.5 Å to 25 Å and the cobalt layer has a thickness in the range of 2.5 Å to 25 Å.

4. The method of claim 2, wherein the ruthenium layer and the cobalt layer have a thickness ratio in the range of 0.95:1 to 1:0.95.

5. The method of claim 1, wherein the first capping layer comprises a ruthenium layer in contact with the top surface of the second conductive line of the conductive fill and the second capping layer comprises a cobalt layer on an opposite side of the ruthenium layer from the top surface of the second conductive line of the conductive fill.

6. The method of claim 5, wherein the first capping layer has a thickness in the range of 2.5 Å to 25 Å and the second capping layer has a thickness in the range of 2.5 Å to 25 Å.

\* \* \* \* \*